United States Patent [19]

Aoyagi et al.

[11] Patent Number: 5,187,453
[45] Date of Patent: Feb. 16, 1993

[54] OSCILLATION CONTROL CIRCUIT

[75] Inventors: Fumitaka Aoyagi; Eiichi Hasegawa, both of Tokyo, Japan

[73] Assignee: Nippon Precision Circuits Ltd., Tokyo, Japan

[21] Appl. No.: 843,795

[22] Filed: Feb. 26, 1992

[30] Foreign Application Priority Data

Mar. 20, 1991 [JP] Japan .................................. 3-56738

[51] Int. Cl.[5] .................. H03B 5/00; H03B 5/36; H03K 3/00; H03K 3/354
[52] U.S. Cl. ................. 331/116 FE; 331/74; 331/109; 331/158; 331/183
[58] Field of Search ............... 331/74, 109, 116 R, 331/116 FE, 158, 182, 183, DIG. 3; 307/261

[56] References Cited

U.S. PATENT DOCUMENTS 4,864,255  9/1989  Yoshida ................. 331/116 FE X

Primary Examiner—David Mis
Attorney, Agent, or Firm—Jordan and Hamburg

[57] ABSTRACT

The output of the first CMOS inverter, connected as an oscillator, is applied to the inputs of second and third CMOS inverters that have logic threshold voltages higher and lower than the logic threshold voltage of the first inverter. The outputs of the second and third CMOS inverters are connected to an output circuit via a logic output circuit. The output of the logic output circuit is shorted by an output control circuit, under the control of the outputs of the second and third CMOS inverters, when the output of the oscillator is between the logic threshold voltages of the second and third inverters.

5 Claims, 3 Drawing Sheets

F I G. 1
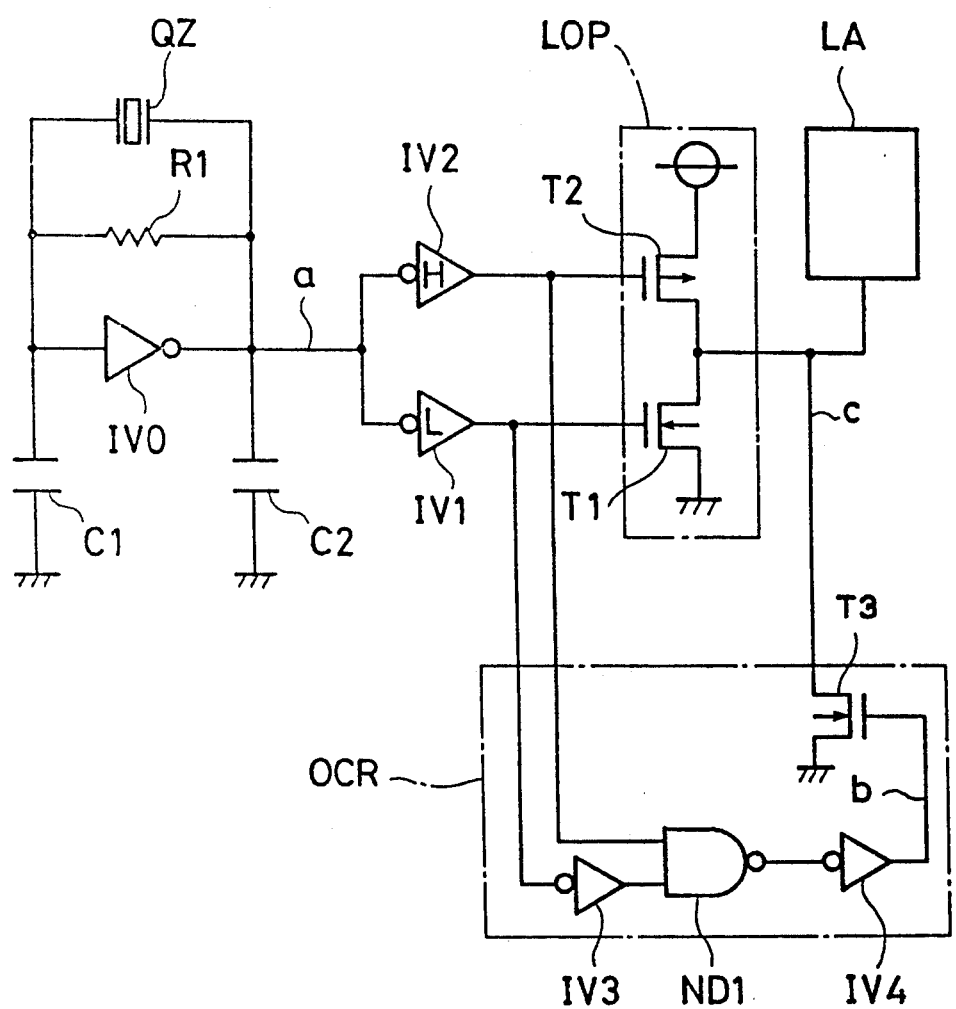

OSCILLATION CONTROL CIRCUIT

FIELD OF THE INVENTION

This invention relates to an oscillation control circuit.

BACKGROUND OF THE INVENTION

When the oscillating output from a quartz oscillatory circuit using a CMOS device is transmitted to a following stage of a circuit, a CMOS inverter forming an output stage is connected to the output of the oscillating CMOS inverter that forms the oscillatory circuit. The next stage of the circuit is connected to the output of this output stage of the CMOS inverter. In this type of circuit, the logic threshold voltages of both CMOS inverters have been heretofore set to the same value.

In the above-described circuit, at the start of the oscillations, the amplitude of the oscillating output is very small, and this oscillating output is inverted by the output stage of the CMOS inverter. The inverted output sets the next stage of circuit into operation. Therefore, the oscillations are unstable as a result of noise produced in the latter stage of the circuit. This hinders the transition from oscillations of quite small amplitude to oscillations of ordinary amplitude.

SUMMARY OF THE INVENTION

It is an object of the present invention to provide an oscillation control circuit which does not permit the following stage of the circuit to operate at the start of oscillations, i.e., when the amplitude of the oscillations is very small, and which permits the next stage of the circuit to begin to operate after the amplitude of the oscillations has exceeded a given level.

BRIEF DESCRIPTION OF THE DRAWINGS

In order that the invention may be more clearly understood, it will now be disclosed in greater detail with reference to the accompanying drawings, wherein:

FIG. 1 is an electrical circuit diagram of an embodiment of the invention;

DESCRIPTION OF PREFERRED EMBODIMENTS OF THE INVENTION

FIG. 1 is an electrical circuit diagram of an oscillation control circuit according to the invention.

Figure 2A:
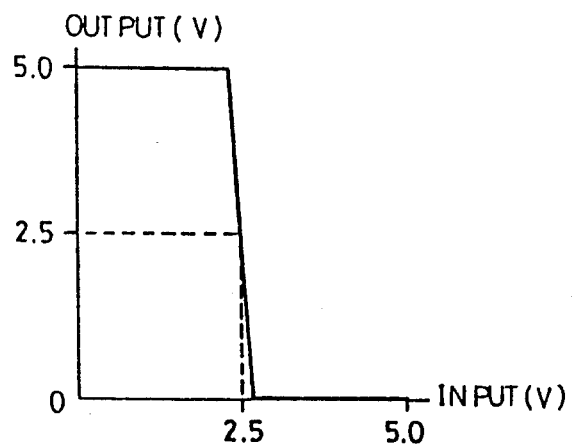
FIGS. 2(A) to 2(C) are graphs showing the input/output characteristics, or transfer characteristics, of the CMOS inverters used in the embodiment shown in FIG. 1.

A CMOS inverter (hereinafter referred to as the first CMOS inverter), indicated by IV0, has input/output characteristics (transfer characteristics) as shown in FIG. 2(A). The inverted potential, or logic threshold voltage, is 2.5 V. The logic threshold voltage referred to herein is an input voltage located midway between the input voltage at which the input/output characteristic curve rises and the input voltage at which the input/output characteristic curve drops. Normally, the logic threshold voltage is the input voltage when the output voltage is half (2.5 V) of the power voltage (5 V). It is assumed that, except for CMOS inverters IV1 and IV2 (described later), those portions of other gate circuits and other circuits which substantially function as inverters have input/output characteristics (transfer characteristics) as shown in FIG. 2(A). It is also assumed that their logic threshold voltage is 2.5 V. Also shown in FIG. 1 are a quartz crystal QZ, a feedback resistor R1, and capacitors C1 and C2. An oscillatory circuit is formed by these circuit components.

Figure 2B:
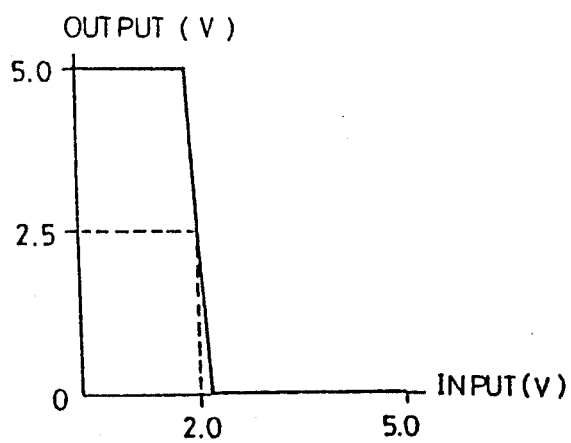
Figure 2C:
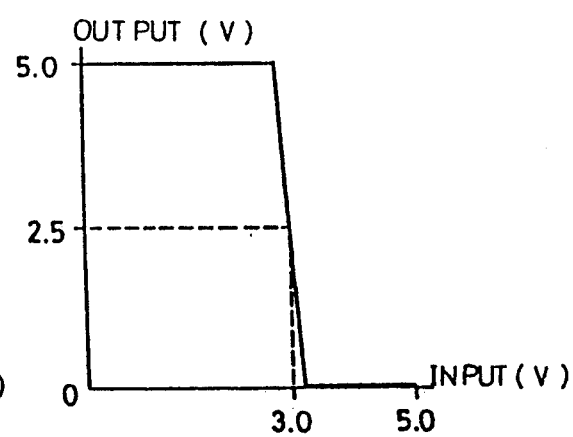

The CMOS inverter IV1 (hereinafter referred to as the second CMOS inverter) has input/output characteristics as shown in FIG. 2(B). Its logic threshold voltage is 2.0 V. The CMOS inverter IV2 (hereinafter referred to as the third CMOS inverter) has input/output characteristics as shown in FIG. 2(C). Its logic threshold voltage is 3.0 V.

An n-channel MOS transistor T1 and a p-channel MOS transistor T2 together form a logic output circuit LOP. A following stage, the circuit LA, is connected to the output of this logic output circuit LOP.

IV3 and IV4 are CMOS inverters and ND1 is a CMOS NAND gate. When the logic output value from the CMOS inverter IV4 is 1, an n-channel MOS transistor T3 forms a short circuit for the outputs of the MOS transistors T1 and T2. An output control circuit OCR is formed by these CMOS inverters IV3, IV4, CMOS NAND gate ND1, and MOS transistor T3.

The gate circuits forming the inverters, the MOS transistors, the following stage circuit LA, and other circuits shown in FIG. 1 are packaged in the same IC chip.

The operation of the present embodiment will now be described with reference to the time chart shown in FIG. 3.

Figure 3A:
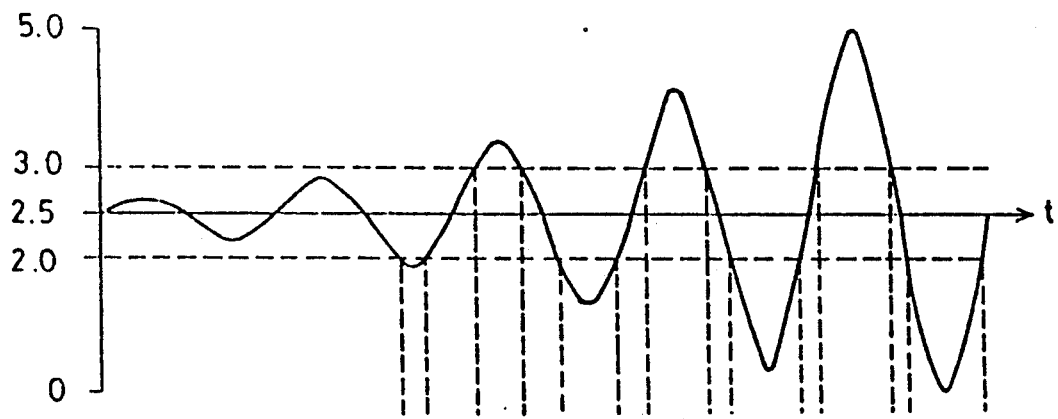
FIGS. 3(A) to 3(C) are time charts illustrating the operation of the embodiment shown in FIG. 1.

FIGS. 3(A), (B), and (C), represent waveforms produced at points a, b, and c, respectively, in the circuit shown in FIG. 1.

As shown in FIG. 3(A), an oscillating signal having a quite small amplitude is produced by the CMOS inverter IV0 when the power supply is turned on. The amplitude of this oscillating signal increases gradually. When the oscillation potential is between the logic threshold voltage (2.0 V) of the CMOS inverter IV1 and the logic threshold voltage (3.0 V) of the CMOS inverter IV2, the logic output value of the inverter IV1 is maintained at 0, and the logic output value of the inverter IV2 is held at 1. Therefore, the MOS transistors T1 and T2 are both cut off. The output of the logic output circuit LOP is then in a high-impedance state. On the other hand, the output logic value of the NAND gate ND1 is 0, and the output logic value of the CMOS inverter IV4 is 1. Thus, the MOS transistor T3 is kept on. Consequently, the output of the logic output circuit LOP is permitted to pass through the MOS transistor T3 to short circuit the output of the circuit LOP.

Figure 3B:
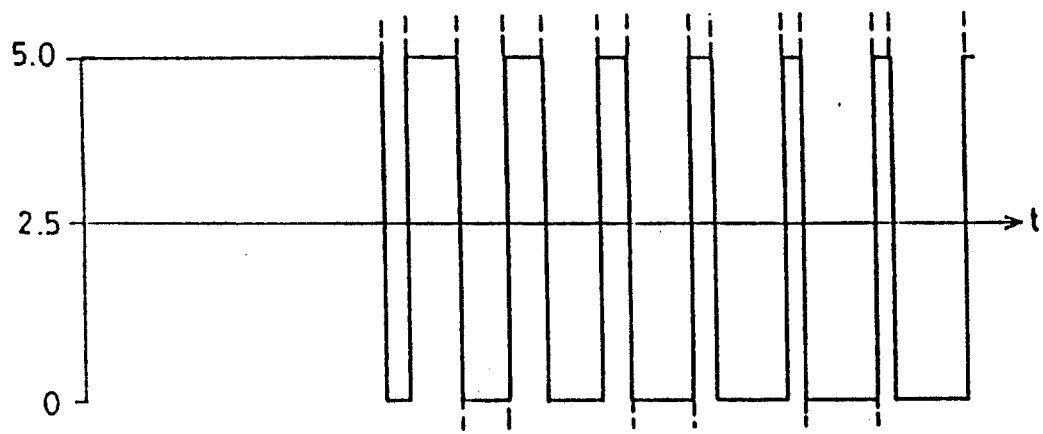
Figure 3C:
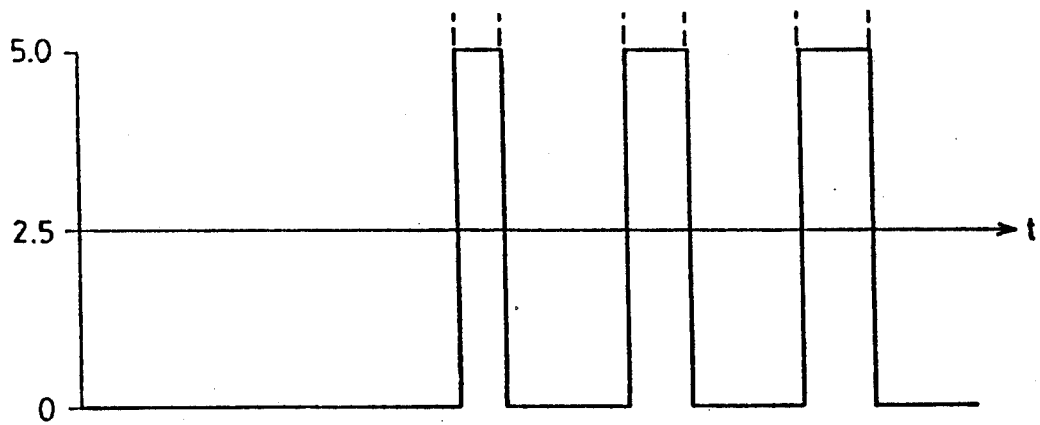

When the oscillation potential of the oscillating signal is lower than the logic threshold voltage (2.0 V) of the CMOS inverter IV1 or higher than the logic threshold voltage (3.0 V) of the CMOS inverter IV2, either the MOS transistor T1 or the MOS transistor T2 is turned on. On the other hand, the output logic value of the NAND gate ND1 is 1, and the output logic value from the CMOS inverter IV4 is 0, as seen in FIG. 3(B). Thus, the MOS transistor T3 is driven into cutoff. In this way, as shown in FIG. 3(C), the logic output circuit LOP produces logic values 0 and 1 alternately in response to the oscillating signal produced from the CMOS inverter IV0. This output, or clock signal, sets the following stage LA of the circuit into operation. Noise is induced by the operation of the following stage circuit LA, but the amplitude of the oscillating signal is sufficiently large at this time. Therefore, the oscillatory operation is not hindered.

In the present embodiment, an n-channel device is used as the MOS transistor T3. A p-channel device can be employed instead by using a logic value opposite to the output logic value from the CMOS inverter IV4.

In the novel oscillation control circuit, the following stage of the circuit does not operate until the amplitude of the oscillating signal reaches a given value. Therefore, the oscillatory operation is not hindered by noise generated in the following stage of the circuit.

Although the present invention has been fully described by way of example with reference to the accompanying drawings, it is to be understood that various changes and modifications will be apparent to those skilled in the art. Therefore, unless such changes and modifications depart from the scope of the invention, they should be construed as being included therein.

What we claim is:

1. An oscillation control circuit comprising:
an oscillatory circuit having a first CMOS inverter and a quartz crystal connected in parallel with the first CMOS inverter, the first CMOS inverter having a first logic threshold voltage;
a second CMOS inverter having a logic threshold voltage lower than the first logic threshold voltage and connected to receive an oscillating signal generated by the first CMOS inverter;
a third CMOS inverter having a third logic potential voltage higher than the first logic threshold voltage and connected to receive the oscillating signal; and
a logic output circuit connected to receive the output signals from the second and third CMOS inverters, to have an output of high impedance when the oscillation potential of the oscillating signal is between the second and third logic threshold voltage, and to produce an output signal having one of two different logic values, depending on whether the oscillation potential is lower than the second logic threshold voltage or higher than the third logic threshold voltage.

2. An oscillation control circuit comprising:
an oscillatory circuit having a first CMOS inverter and a quartz crystal connected in parallel with the first CMOS inverter, the first CMOS inverter having a first logic threshold voltage;
a second CMOS inverter having a second logic threshold voltage lower than the first logic threshold voltage and connected to receive an oscillating signal generated by the first CMOS inverter;
a third CMOS inverter having a third logic threshold voltage higher than the first logic threshold voltage and connected to receive the oscillating signal;
a logic output circuit connected to receive the output signals from the second and third CMOS inverters, to have a high output impedance when the oscillation potential of the oscillating signal is between the second and third logic threshold voltage, and to provide an output signal having one of two different logic values, depending on whether the oscillation potential is lower than the second logic threshold voltage or higher than the third logic threshold voltage; and
an output control circuit connected to form a short circuit for the output from the logic output circuit when the oscillation potential is between the second and third logic threshold voltages.

3. An oscillation control circuit comprising:
an oscillatory circuit comprising a first CMOS inverter coupled to a quartz crystal;
second and third CMOS inverters coupled to receive the output of said first CMOS inverter, said second and third CMOS inverters having logic threshold voltages that are above and below, respectively, the logic threshold voltage of said first CMOS inverter;
a logic output circuit coupled to receive the outputs of said second and third CMOS inverters, said logic output circuit having an output terminal circuit; and
control means responsive to input voltages to said second and third CMOS inverters between said second and third logic threshold voltages for shorting said output terminal, said control means further comprising means responsive to input voltages to said second and third CMOS inverters above said second logic threshold voltage and below said third logic threshold voltage for unshorting said output terminal circuit to permit the selective application of low and high logic level voltages to said output terminal circuit by said logic output circuit.

4. The oscillation control circuit of claim 3, wherein said logic output circuit comprises first and second series connected MOS transistors connected to receive the output of a separate one of said second and third CMOS inverters, said output terminal circuit comprising the junction of said MOS transistors.

5. The oscillation control circuit of claim 3, wherein said control means comprises a NAND gate connected to receive a noninverted output from one of said second and third CMOS inverters and an inverted output from the other of said second and third CMOS inverters, and a circuit coupled to the output of said gate for selectively shorting said output terminal circuit.

* * * * *